United States Patent
Inaba

(10) Patent No.: US 9,881,879 B2
(45) Date of Patent: Jan. 30, 2018

(54) POWER SEMICONDUCTOR MODULE

(71) Applicant: FUJI ELECTRIC CO., LTD., Kawasaki-shi, Kanagawa (JP)

(72) Inventor: Yuki Inaba, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/449,340

(22) Filed: Mar. 3, 2017

(65) Prior Publication Data
US 2017/0271275 A1    Sep. 21, 2017

(30) Foreign Application Priority Data
Mar. 18, 2016   (JP) .................. 2016-055485

(51) Int. Cl.
*H01L 23/00* (2006.01)
*H01L 23/31* (2006.01)
(Continued)

(52) U.S. Cl.
CPC ........ *H01L 23/562* (2013.01); *H01L 23/3107* (2013.01); *H01L 23/3672* (2013.01);
(Continued)

(58) Field of Classification Search
CPC ......... H01L 2924/181; H01L 2924/351; H01L 23/3735; H01L 2924/01051; H01L 2924/01029; H01L 2924/0105; H01L 2924/00014; H01L 2224/48247; H01L 2924/014; H01L 2924/01028; H01L 2924/01082; H01L 2924/01013; H01L 2224/29111; H01L 2224/05111;
(Continued)

(56) References Cited

U.S. PATENT DOCUMENTS

2006/0246304 A1* 11/2006 Ishihara ............... B23K 35/007
428/446
2011/0075451 A1*  3/2011 Bayerer ................. H01L 24/06
363/37

FOREIGN PATENT DOCUMENTS

JP   2001-110957 A   4/2001
JP   2005-129886 A   5/2005
(Continued)

OTHER PUBLICATIONS

Yoshitsugu Sakamoto, "Assembly Technologies of Double-sided Cooling Power Modules", Denso Technical Review, vol. 16, pp. 46-56, 2011.

*Primary Examiner* — Jasmine Clark
(74) *Attorney, Agent, or Firm* — Rabin & Berdo, P.C.

(57) ABSTRACT

In a power semiconductor module, the 0.2% yield strength of solder under a lead terminal that bonds the lead terminal and a semiconductor element is set to be lower than the 0.2% yield strength of solder under the semiconductor element that bonds the semiconductor element and an insulating substrate. As a result, the lead terminal is expanded with self-heating by energization of the semiconductor element, and stress is applied to the semiconductor element via the solder under the lead terminal. However, the solder under the lead terminal with low 0.2% yield strength reduces the stress that is applied to the semiconductor element. Thus, the reliability of a surface electrode of the semiconductor element that is bonded to the solder under the lead terminal is improved.

18 Claims, 10 Drawing Sheets

(51) Int. Cl.
    *H01L 23/367*          (2006.01)
    *H01L 23/495*          (2006.01)
    *H01L 29/739*          (2006.01)

(52) U.S. Cl.
    CPC .. *H01L 23/49562* (2013.01); *H01L 23/49568* (2013.01); *H01L 23/49582* (2013.01); *H01L 29/7393* (2013.01); *H01L 2224/40225* (2013.01); *H01L 2924/181* (2013.01)

(58) Field of Classification Search
    CPC ..... H01L 2224/05647; H01L 23/49568; H01L 2224/13311; H01L 2224/13155; H01L 2224/29211; H01L 2224/13347
    See application file for complete search history.

(56) References Cited

FOREIGN PATENT DOCUMENTS

| | | |
|---|---|---|
| JP | 2006-202885 A | 8/2006 |
| JP | 2006-287064 A | 10/2006 |
| JP | 4730181 B2 | 7/2011 |

\* cited by examiner

| SOLDER STRENGTH | COMPARATIVE EXAMPLE 1 (A>B) | COMPARATIVE EXAMPLE 2 (A=B) | EXAMPLES 1 AND 2 (A<B) |
|---|---|---|---|
| TjP/C LIFETIME | 100kcyc. | 200kcyc. | 1000kcyc. OR MORE |

FIG. 6

POWER SEMICONDUCTOR MODULE

CROSS-REFERENCE TO RELATED APPLICATION

This application is based upon and claims the benefit of priority of the prior Japanese Patent Application No. 2016-055485, filed on Mar. 18, 2016, the entire contents of which are incorporated herein by reference.

BACKGROUND OF THE INVENTION

1. Field of the Invention

The embodiments discussed herein are related to a power semiconductor module using a power semiconductor element that controls high current and high voltage.

2. Background of the Related Art

A power semiconductor module includes a plurality of power semiconductor elements, and is used as, for example, a power conversion element of an inverter apparatus. As the power semiconductor element, there are a metal oxide semiconductor field effect transistor (MOSFET), an insulated gate bipolar transistor (IGBT), a freewheeling diode (FWD), and the like. Further, as the power semiconductor element, there are a reverse conducting (RC)-IGBT formed by integrating the IGBT and the FWD, and a reverse blocking (RB)-IGBT having a sufficient withstand voltage against reverse bias.

In such a power semiconductor module, the semiconductor element has an electrode on a rear surface thereof which is bonded to an insulating substrate by solder and a front-surface-side electrode, through which main current flows, bonded to a wiring conductor by solder. Here, it is well known to use solder with different physical properties for the rear surface and the front surface of the semiconductor element (e.g., refer to Japanese Laid-open Patent Publication No. 2006-287064 and Japanese Patent No. 4730181).

It is an object of the semiconductor device in Japanese Laid-open Patent Publication No. 2006-287064 to realize a bonding portion which is excellent in heat resistance and thermal fatigue resistance. To this end, as solder paste for bonding the semiconductor element and the conductor of the insulating substrate, "Sn(tin)-3.5Ag(silver) -0.5Cu(copper), (melting temperature: 220° C." is used. Further, as cream solder for bonding the wiring conductor and the semiconductor element, "Sn-20Ag-5Cu (solidus line temperature: 220° C. and liquidus line temperature: 345° C.)" is used. In addition, also taking into account the heat release to the front surface side of the semiconductor element, the wiring conductor bonded to the semiconductor element is made of a copper material whose bonding portion to the semiconductor element is thick and also large in area, and has a wiring portion extending out from the top end thereof in the surface direction of the semiconductor element.

Japanese Patent No. 4730181 discloses a semiconductor device in which a semiconductor element is sandwiched by two conductor members and the freezing point of the solder that reaches the lower side of the semiconductor element when the solder reflows is set to be lower than the freezing point of the solder that reaches the upper side of the semiconductor element.

Chips having mounted thereon semiconductor elements used for power semiconductor modules are made thin, and silicon substrates with a thickness of 100 micrometers (μm) or less have become available. Further, the semiconductor elements are each bonded by solder to an insulating substrate as a supporter thereof and to a lead terminal as a wiring conductor. Furthermore, the thus configured semiconductor element, insulating substrate, and lead terminal are sealed with epoxy resin, for example.

The lead terminal is thermally expanded by heating of the semiconductor element. At this time, the lead terminal is pressed by sealing with resin and is therefore expanded toward the thin semiconductor element. As a consequence, high stress is applied to the semiconductor element from the lead terminal, and this causes generation of cracks on a surface electrode of the semiconductor element and may cause breakage thereof.

SUMMARY OF THE INVENTION

In one aspect of the embodiments, there is provided a power semiconductor module including: a semiconductor element having one surface and another surface opposite to the one surface; a lead terminal electrically and thermally connected to the semiconductor element; a first solder that bonds the lead terminal and the one surface of the semiconductor element; an insulating substrate including an insulating plate having one surface and another surface opposite to the one surface, a circuit layer arranged on the one surface of the insulating plate, and a metal foil arranged on the other surface of the insulating plate; a second solder that bonds the other surface of the semiconductor element and the circuit layer of the insulating substrate; and a resin that seals at least the semiconductor element, the lead terminal, the first solder, and the insulating substrate, wherein a relationship of A<B holds with A being a 0.2% yield strength of the first solder and B being a 0.2% yield strength of the second solder.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2A is a circuit diagram of an RC-IGBT as the semiconductor element, and FIG. 2B is a plan view of the RC-IGBT as the semiconductor element;

FIG. 6 illustrates results of a reliability test in Examples 1 and 2 and Comparative examples 1 and 2;

DETAILED DESCRIPTION OF THE INVENTION

Figure 1:
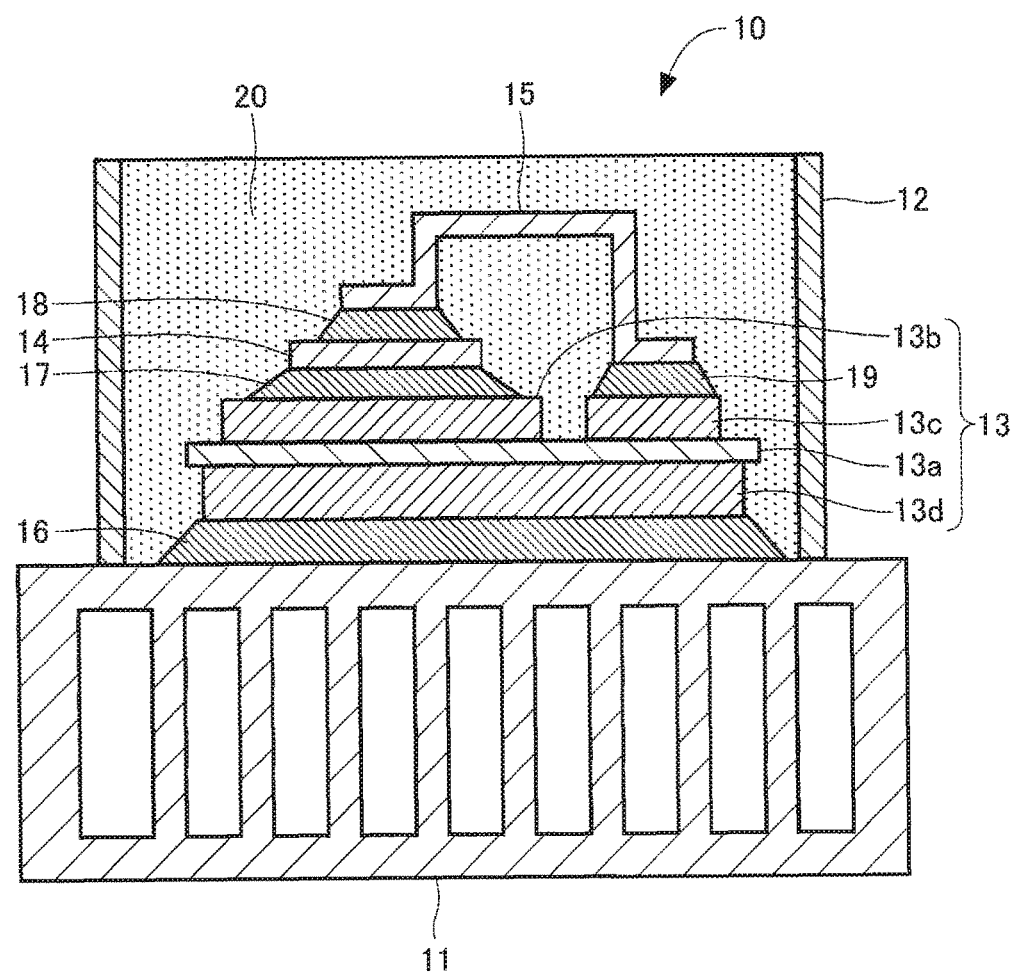
FIG. 1 illustrates an example of a power semiconductor module according to a first embodiment.

Several embodiments will be described in detail below with reference to the accompanying drawings, wherein like reference numerals refer to like elements throughout and a description of the details is omitted. Further, the embodiments are not limited to the following embodiments and the essentials thereof are embodied with proper modification without change.

(First embodiment)

Figure 2A:
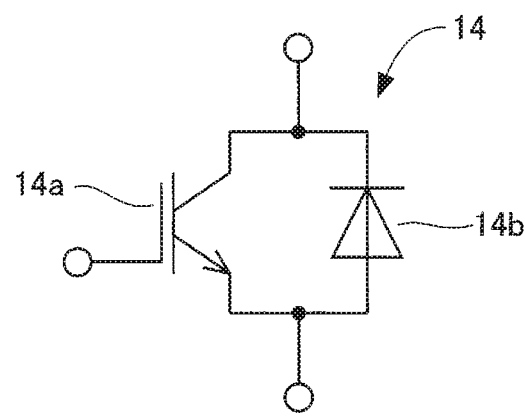
FIGS. 2A and 2B illustrate an example of a semiconductor element.
Figure 2B:
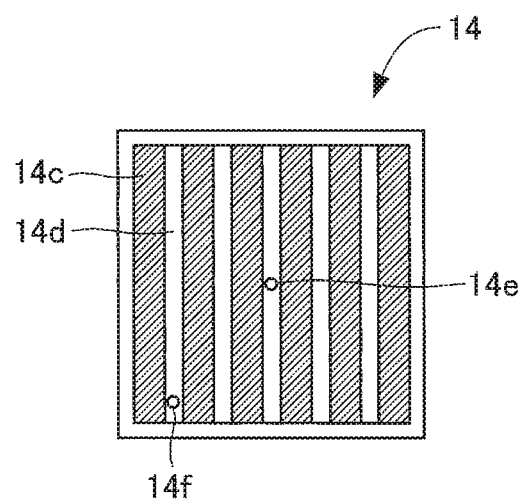
Figure 3:
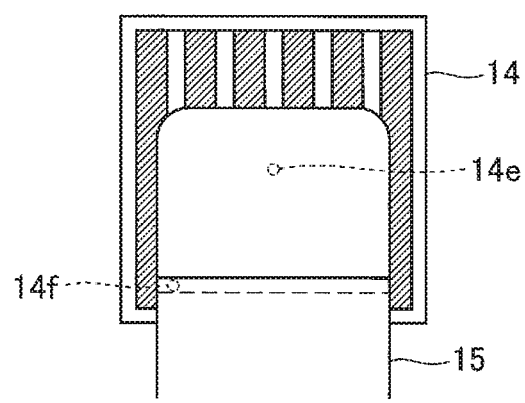
FIG. 3 is a plan view of a bonding state of the semiconductor element and a lead terminal.
Figure 4:
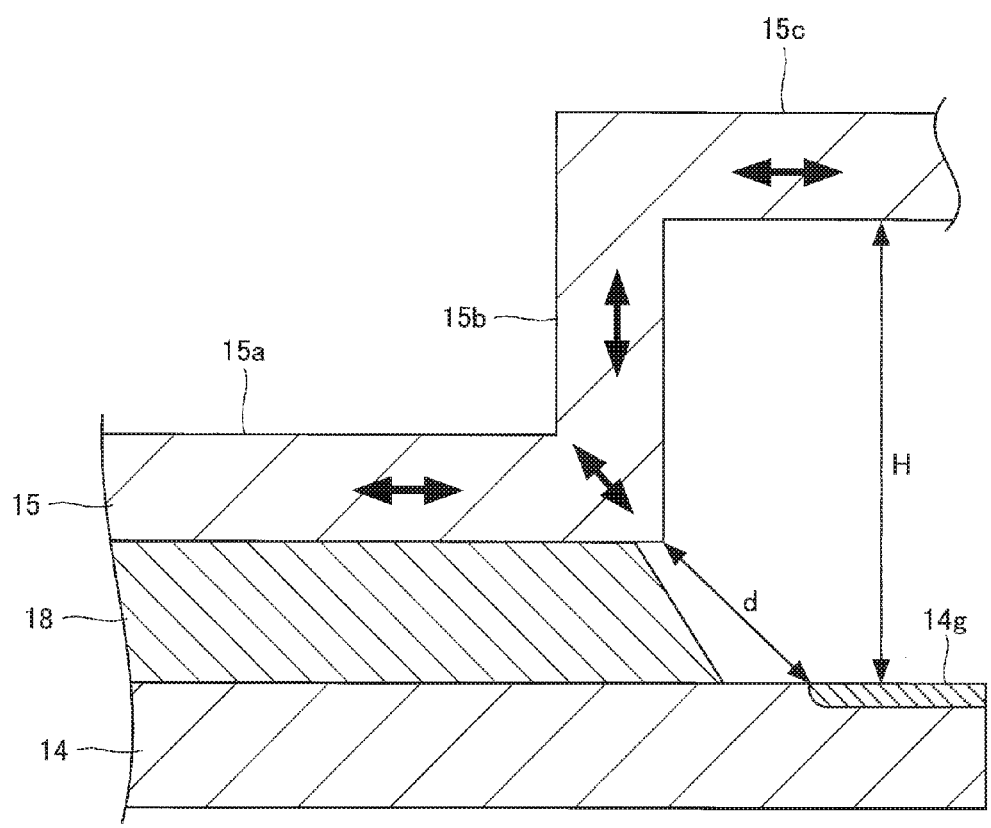
FIG. 4 is a partial enlarged cross-sectional view of a bonding portion of the semiconductor element and the lead terminal.
Figure 5:
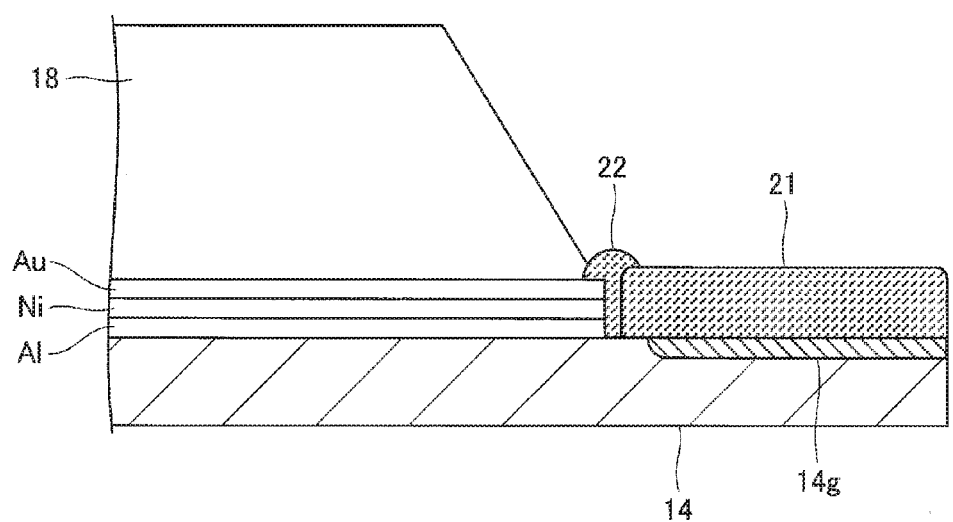
FIG. 5 is a partial enlarged cross-sectional view of the vicinity of a guard ring and a surface electrode of the semiconductor element.

FIG. 1 illustrates an example of a power semiconductor module according to a first embodiment. FIGS. 2A and 2B illustrate an example of a semiconductor element, FIG. 2A is a circuit diagram of an RC-IGBT as the semiconductor element, and FIG. 2B is a plan view of the RC-IGBT as the semiconductor element. FIG. 3 is a plan view of a bonding state of the semiconductor element and a lead terminal. FIG. 4 is a partial enlarged cross-sectional view of a bonding portion of the semiconductor element and the lead terminal. FIG. 5 is a partial enlarged cross-sectional view of the vicinity of a guard ring and a surface electrode of the semiconductor element. Note that, regarding the power semiconductor module according to the first embodiment illustrated in FIG. 1, a main part cross-section of an example thereof is schematically illustrated.

As illustrated in FIG. 1, a power semiconductor module 10 includes: an insulating substrate 13; a semiconductor element 14; and a lead terminal 15. The power semiconductor module 10 may include: a cooler 11; and a case 12 that is placed on the cooler 11 and accommodates the insulating substrate 13, the semiconductor element 14, and the lead terminal 15.

The cooler 11 is made of, for example, Al (aluminum) excellent in thermal conductivity, and has a cavity therein in which a plurality of fins is provided. A space between the fins provides a passage for a cooling medium. As such a cooling medium, a liquid medium such as ethylene-glycol aqueous solution and water is used, for example. As the cooling medium, in addition to the liquid medium, a gas medium such as air is used, for example. Furthermore, a phase-changeable cooling medium that performs cooling by evaporating and vaporizing with the cooler 11 such as chlorofluorocarbon is used.

A direct copper bonding (DCB) substrate may be used as the insulating substrate 13. That is, the insulating substrate 13 includes: a ceramic insulating plate 13a; circuit layers 13b and 13c that are formed on a front surface (upper surface) of the ceramic insulating plate 13a; and a metal foil 13d formed on a rear surface (lower surface) of the ceramic insulating plate 13a. The metal foil 13d is bonded to the cooler 11 by solder 16 under the insulating substrate. The circuit layer 13b is bonded to the lower surface of the semiconductor element 14 by solder 17 under the semiconductor element. Since the ceramic insulating plate 13a is insulative, a space between the circuit layer 13b and the metal foil 13d is not electrically conductive. In place of the bonding using the solder, the insulating substrate 13 and the cooler 11 may be thermally connected by grease between the metal foil 13d and the cooler 11.

The solder 16 under the insulating substrate thermally and mechanically connects the insulating substrate 13 and the cooler 11. The solder 16 under the insulating substrate as described above preferably is a high-strength solder for high reliability, and contains a Sn—Sb (antimony) system or Sn—Sb—Ag system, for example.

In one embodiment, the semiconductor element is a semiconductor chip. The semiconductor chip may include one or more transistors, one or more diodes, a combination of one or more transistors and one or more diodes, or any other semiconductor circuitry. In one embodiment, the semiconductor element 14 is an RC-IGBT. As illustrated in FIG. 2A, the RC-IGBT is formed by integrating an IGBT 14a and an FWD (freewheeling diode) 14b. That is, the RC-IGBT has a structure in which the IGBT 14a and the FWD 14b are antiparallel-connected. The collector terminal of the IGBT 14a is connected to the cathode terminal of the FWD 14b, thereby forming a surface electrode on the rear surface of the semiconductor element 14. The surface electrode on the rear surface of the semiconductor element 14 is bonded to the circuit layer 13b by the solder 17 under the semiconductor element.

The solder 17 under the semiconductor element thermally and mechanically connects the semiconductor element 14 and the circuit layer 13b. The solder 17 under the semiconductor element is preferably Sn—Sb-based solder or Sn—Ag—Cu-based solder to relatively firmly bond the semiconductor element 14 and the circuit layer 13b.

Preferably, the Sn—Sb-based solder contains Sb of 0.1 to 15 wt % with the rest containing Sn and inevitable impurities. When the Sb content is less than 0.1 wt %, cracks are easily generated in the solder. Therefore, the possibility that preferable reliability is not ensured is high. When the Sb content exceeds 15 wt %, the soldering temperature exceeds 300° C., which leads to a concern of an increase in failure rate due to crystallization of a peripheral nickel film. Further preferably, the Sb content is in a range of 2.8 to 15 wt %. Using solder containing Sb 2.8 wt % or more, the reliability of the power semiconductor module 10 is easily improved.

Preferably, the Sn—Ag—Cu-based solder contains Ag of 3.5 wt % and Cu of 0.5 wt %, with the rest containing Sn and inevitable impurities.

In the RC-IGBT, the emitter terminal of the IGBT 14a is connected to the anode terminal of the FWD 14b, thereby forming the surface electrode on the front surface of the semiconductor element 14. As illustrated in FIG. 2B, the RC-IGBT has a structure in which a plurality of IGBT areas 14c and a plurality of FWD areas 14d are alternately arranged in a stripe form. Although not illustrated in FIG. 2B, the RC-IGBT has a surface electrode that is connected to emitter terminals of the IGBTs 14a in the plurality of IGBT areas 14c and anode terminals of the FWDs 14b in the plurality of FWD areas 14d. The front surface of the semiconductor element 14 has a surface electrode for control that is connected to a gate terminal of the IGBT 14a. Further, in the semiconductor element 14, temperature sensors 14e and 14f are integrally formed in the center and peripheral thereof.

One end of the lead terminal 15 is bonded to the surface electrode of the emitter terminal on the front surface of the semiconductor element 14 by the solder 18 under the lead terminal. The other end of the lead terminal 15 is bonded to the circuit layer 13c of the insulating substrate 13 by the solder 19 under the lead terminal.

The solder 18 under the lead terminal electrically and thermally connects the lower surface of the lead terminal 15 and the surface electrode of the semiconductor element 14. The solder 18 under the lead terminal is used for a part where the surface electrode of the semiconductor element 14 receives strong stress from the lead terminal 15, and therefore uses solder with 0.2 % yield strength lower than that of the solder 17 under the semiconductor element. For example, the solder 18 under the lead terminal is preferably a Sn—Cu-based solder. Accordingly, before heat expansion and contraction of the lead terminal 15 applies stress to the semiconductor element 14, the solder 18 under the lead terminal serves to absorb the stress. Therefore, the reliability of the surface electrode of the semiconductor element 14 is improved due to reduction of the stress applied to the surface electrode on the front surface of the semiconductor element 14. Preferably, the Sn—Cu-based solder contains Cu of 0.1 to 1.0 wt %, with the rest containing Sn and inevitable impurities. When the content of Cu is less than 0.1 wt %, cracks are easily generated in the solder. Therefore, the possibility that the preferable reliability is not ensured is high. When the content of Cu exceeds 1.0 wt %, the 0.2 % yield strength of the solder is higher than that of aluminum of the surface electrode of the semiconductor element 14. When a trouble happens, the possibility that a cell is short-circuited becomes high. Note that, as the solder 19 under the lead terminal, the same material as that of the solder 17 under the semiconductor element may be used. Here, the 0.2 % yield strength is a numerical value at 50° C., for example.

Metal of a material with low electrical resistance and high heat conductivity is preferably used for the lead terminal 15. Specifically, the lead terminal 15 preferably contains Cu or Al. In the embodiment, Cu with a thermal expansion coefficient lower than that of Al is used.

As illustrated in FIG. 3, the lead terminal 15 is bonded to the semiconductor element 14 by the solder 18 under the lead terminal to cover the temperature sensor 14e at least in the center of the semiconductor element 14.

Further, the lead terminal 15 is formed by bending a strip-shaped copper sheet. As illustrated in FIG. 4, the lead terminal 15 includes: a bonding portion 15a that is bonded by the solder 18 under the lead terminal; a raised portion 15b that is bent upward in FIG. 4 from an end of the bonding portion 15a; and a horizontal portion 15c bent in the parallel direction to the surface of the semiconductor element 14 from the end of the raised portion 15b. Here, the raised portion 15b of the lead terminal 15 is expanded and contracted in the vertical direction with heat of the semiconductor element 14, and is a portion for applying stress in the vertical direction to the solder 18 under the lead terminal and a main surface of the semiconductor element 14, and therefore is formed to be shorter as much as possible. However, a distance H between a guard ring 14g of the semiconductor element 14 and the horizontal portion 15c of the lead terminal 15 is set to a distance that does not generate spatial discharge with a voltage lower than a prescribed withstand voltage of the power semiconductor module in consideration of air pressure, temperature, and humidity of use environment, and a dielectric constant. Obviously, also at a position where the lead terminal 15 is bonded to the semiconductor element 14 by solder, the shortest distance d from the bending portion of the bonding portion 15a and the raised portion 15b to the guard ring 14g is set to a distance at which the spatial discharge is not caused therebetween.

Further, with the lead terminal 15, it is determined by simulation that the bending portion of the bonding portion 15a and the raised portion 15b increases the stress operating in the diagonal direction to the solder 18 under the lead terminal and the semiconductor element 14. The bending portion connecting the bonding portion 15a and the raised portion 15b applies stress to the solder 18 under the lead terminal and the surface electrode of the semiconductor element 14 in a diagonal direction illustrated by an arrow when the bonding portion 15a and the raised portion 15b are expanded in the horizontal and vertical directions with the heat of the semiconductor element 14. If the lead terminal 15 is constrained by sealing resin 20, the stress is remarkable. Under a restriction that the stress needs to be smaller and a restriction in manufacturing at time of bending work, the lead terminal 15 preferably has a thickness of approximately 0.5 mm to 1.0 mm. In the illustrated example, in the lead terminal 15, the main surface of the bonding portion 15a is arranged along the front surface of the semiconductor element 14. The main surface of the bonding portion 15a is preferably arranged to be approximately in parallel to the front surface of the semiconductor element 14. In the lead terminal 15, an angle $\alpha$ formed by the bonding portion 15a and the raised portion 15b, i.e., the angle $\alpha$ between the both is, e.g., approximately 90°, and may be selected within a range of 10° to 180°. When $\alpha$ is less than 10°, it is hard to precisely bend the lead terminal, and the spatial discharge is caused when $\alpha$ exceeds 180°.

Among the components accommodated in the case 12, the sealing resin 20 seals at least the lead terminal 15, the solder 18 under the lead terminal, the semiconductor element 14, the solder 17 under the semiconductor element, the circuit layer 13b, and the ceramic insulating plate 13a. If the sealing resin 20 seals the lead terminal 15 and the like, the power semiconductor module 10 need not have the case 12.

The sealing resin 20 preferably has predetermined insulating property and high moldability, and epoxy resin, maleimide resin, and the like, are preferably used therefor. In addition, as the sealing resin 20, polyimide resin, isocyanate resin, amino resin, phenol resin, silicone based resin or other thermoset resins may be used. The sealing resin 20 may further contain an additive substance such as inorganic filler. Further, the sealing resin 20 has a function for reducing the distance at which the spatial discharge is caused between the guard ring 14g and the lead terminal 15 with a dielectric constant of the sealing resin 20. For example, in the semiconductor element 14 with withstand voltage of 1200 (V) assuming the usage at a highland of an altitude of 4500 meters where a discharge condition is low, the distance H between the guard ring 14g of the semiconductor element 14 and the horizontal portion 15c of the lead terminal 15 may be approximately 1.1 mm.

Referring to FIG. 5, in the semiconductor element 14, the front surface of the guard ring 14g is covered with an organic film, and the surface electrode is made of three-layer metal. A film on the guard ring 14g is polyimide 21, and the metal of the surface electrode is Al, Ni (nickel), and Au (gold) in order from the bottom. Regarding the thickness of the respective metallic layers, e.g., Al is 2 µm to 6 µm in thickness, Ni is 3 µm to 6 µm, and Au is 0.02 µm to 0.1 µm. Between the polyimide (first polyimide) 21 and the three-layer metal, another polyimide (second polyimide) 22 is filled. The second polyimide 22 fills a fine space between the polyimide 21 and the three-layer metal, which is inevitably generated for the reason of manufacturing process. As a result, it is prevented that the solder 18 under the lead terminal flows into the space and peels the three-layer metal with expansion and contraction of the solder 18 under the lead terminal with heat.

Further, in the power semiconductor module 10, the solder 16 under the insulating substrate, the solder 17 under the semiconductor element, and the solder 18 and 19 under the lead terminal are melt at temperature of 300° C. or less in a reflow furnace, and solder bonding is performed. Preferably, the temperature of the reflow furnace is approximately 260° C. because solder melting temperature (melting point) is set to a crystallization temperature or less that metamorphoses Ni forming the surface electrode of the semiconductor element 14 from an amorphous state to a crystal state to prevent Ni from becoming hard and brittle. As a consequence, a failure rate of the power semiconductor module 10 due to a crack of Ni is reduced even when the surface electrode of the semiconductor element 14 receives stress from the lead terminal 15.

Note that, with the power semiconductor module as described above, the number of sets of the semiconductor element 14 and the lead terminal 15 is not limited to one but may be plural. When a plurality of semiconductor elements 14 is arranged in parallel, a rated output of the power semiconductor module 10 may be increased. Further, when two semiconductor elements 14 are serially arranged, a power semiconductor module 10 of a half-bridge inverter circuit may be constructed. Further, when a plurality of semiconductor elements 14 is arranged, different types of semiconductor elements 14 may be arranged if needed.

Next, a description will be given of an example of the solder 17 under the semiconductor element and the solder 18 under the lead terminal in the power semiconductor module 10. Here, as the semiconductor element 14, one obtained by forming the RC-IGBT on a silicon substrate is used. The thickness of the silicon substrate is approximately 60 μm or more and approximately 120 μm or less, preferably, approximately 80 μm. Further, the temperature of the reflow furnace is 260 ° C. at which Ni of the surface electrode is not crystallized. Furthermore, in a power cycle test, a progress status of deterioration is observed by cutting of a sample obtained by repeating, a predetermined number of times, self-heating (175° C.) due to energization of the semiconductor element 14 and a cooling operation due to shutoff.

EXAMPLE 1

The solder 18 under the lead terminal contains Sn-0.7Cu, i.e., Sn as a main component, and additionally contains Cu at a concentration of 0.7 wt %. The solder 17 under the semiconductor element contains Sn-5Sb, i.e., Sn as a main component, and additionally contains Sb at a concentration of 5 wt %. At this time, the 0.2% yield strength of Sn-0.7Cu is 18.5 Mega Pascal (MPa) at 50° C., and the 0.2% yield strength of Sn-5Sb is 24.8 MPa at 50° C. Consequently, when the 0.2% yield strength of the solder under the lead terminal is 'A' and the 0.2% yield strength of the solder 17 under the semiconductor element is 'B', a relationship of A<B holds.

EXAMPLE 2

The solder 18 under the lead terminal contains Sn-0.7Cu, i.e., Sn as a main component, and additionally contains Cu at a concentration of 0.7 wt %. The solder 17 under the semiconductor element contains Sn-3.5Ag-0.5Cu, i.e., Sn as a main component, and additionally contains Ag at a concentration of 3.5 wt % and Cu at a concentration of 0.5 wt %. At this time, the 0.2% yield strength of Sn-0.7Cu is 18.5 MPa at 50° C., and the 0.2% yield strength of Sn-3.5Ag-0.5Cu is 20.0 MPa at 50° C. Consequently, when the 0.2% yield strength of the solder 18 under the lead terminal is 'A', and the 0.2% yield strength of the solder 17 under the semiconductor element is 'B', a relationship of A<B holds.

COMPARATIVE EXAMPLE 1

The solder 18 under the lead terminal contains Sn-3.5Ag-0.5Cu, that is, contains Sn as a main component and additionally contains Ag at a concentration of 3.5 wt % and Cu at a concentration of 0.5 wt %. The solder 17 under the semiconductor element contains Sn-0.7Cu, i.e., Sn as a main component, and additionally contains Cu at a concentration of 0.7 wt %. At this time, the 0.2% yield strength of Sn-3.5Ag-0.5Cu is 20.0 MPa at 50° C., and the 0.2% yield strength of Sn-0.7Cu is 18.5 MPa at 50° C. Consequently, when the 0.2% yield strength of the solder under the lead terminal is 'A' and the 0.2% yield strength of the solder 17 under the semiconductor element is 'B', a relationship of A>B holds.

COMPARATIVE EXAMPLE 2

The solder 18 under the lead terminal contains Sn as a main component, and additionally contains Cu at a concentration of 0.7 wt %. The solder 17 under the semiconductor element contains Sn as a main component, and additionally contains Cu at a concentration of 0.7 wt %. At this time, both of the 0.2% yield strength of the solder 18 under the lead terminal and the solder 17 under the semiconductor element are 18.5 MPa at 50° C. Therefore, when the 0.2% yield strength of the solder 18 under the lead terminal is 'A' and the 0.2% yield strength of the solder 17 under the semiconductor element is 'B', a relationship of A=B holds.

FIG. 6 illustrates results of a reliability test according to Examples 1 and 2 and Comparative examples 1 and 2.

FIG. 6 illustrates a result of associating magnitude relationships between parameters 'A' and 'B' with element lifetimes for repetitively changed temperatures of the semiconductor element, with 'A' being the 0.2% yield strength of the solder 18 under the lead terminal and 'B' being the 0.2% yield strength of the solder 17 under the semiconductor element.

That is, in Comparative example 1 of A>B, the power semiconductor module 10 reaches the lifetime when the power cycle test is performed 100000 (100 kcyc.) times. In Comparative example 2 of A=B, the power semiconductor module 10 reaches the lifetime when the power cycle test is performed 200000 (200 kcyc.) times. On the other hand, in Examples 1 and 2 with the relationship of A<B, the power semiconductor module 10 does not reach the lifetime when the power cycle test is performed 1000000 (1000 kcyc.) times or more.

Figure 7:
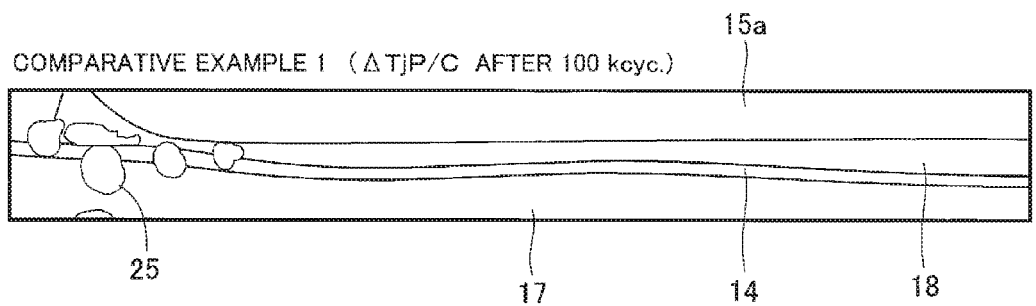
FIG. 7 is a partial cross-sectional view of a state of the semiconductor element when a power semiconductor module in Comparative example 1 reaches the lifetime.

FIG. 7 is a partial cross-sectional view of a state of the semiconductor element when a power semiconductor module in Comparative example 1 reaches the lifetime.

FIG. 7 illustrates how the power semiconductor module 10 of Comparative example 1 is broken when the power semiconductor module 10 reaches the lifetime, in particular, a state near a bending portion (left end in FIG. 7) where the bonding portion 15a of the lead terminal 15 is raised. The lead terminal 15 applies high stress to the solder 18 under the lead terminal and the semiconductor element 14 with the bending portion, and some partial deteriorating portions 25 are generated just under the bending portion. The solder 18 under the lead terminal repetitively receives stress from the lead terminal 15, a crack is generated in Al of the surface electrode of the semiconductor element 14, and a cell of a transistor forming the RC-IGBT just under Al is damaged, thereby generating the deteriorating portions 25. That is, when the cell is short-circuited, high current flows through the portion, the solder 18 under the lead terminal and the semiconductor element 14 on a path of the current are instantly at high temperature and melted, and a hole is formed, thereby forming the deteriorating portions 25. Even after performing the power cycle test 100000 (100 kcyc.) times, a large change is not observed at a portion except for the portion just under the bending portion of the lead terminal 15.

Figure 8:
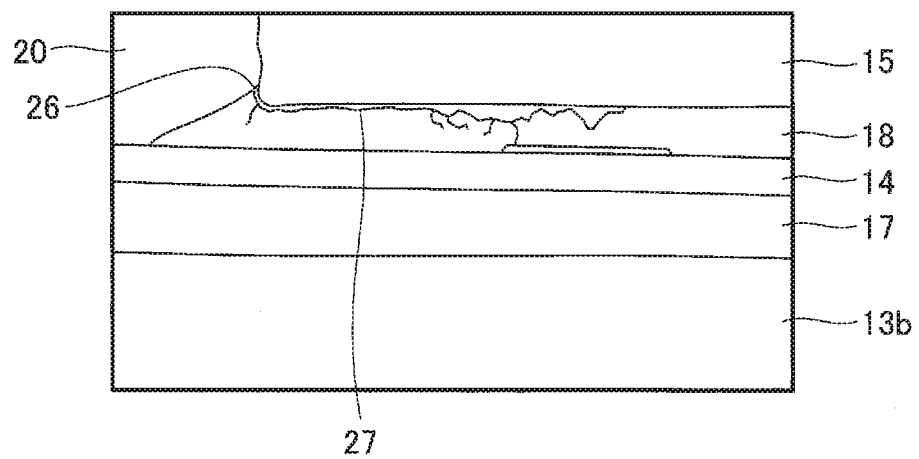
FIG. 8 is a partial cross-sectional view of a half-way passage state in which the power semiconductor module in Comparative example 2 deteriorates when the power semiconductor module in Comparative example 1 reaches the lifetime.

FIG. 8 is a partial cross-sectional view of a half-way passage state in which a power semiconductor module in Comparative example 2 deteriorates when the power semiconductor module in Comparative example 1 reaches the lifetime.

In Comparative example 2 in which the 0.2% yield strength of the solder 18 under the lead terminal is the same as the 0.2% yield strength of the solder 17 under the semiconductor element, the deterioration state after having performed the power cycle test over half the lifetime is substantially different from the case in Comparative example 1. That is, a crack 27 is generated in the solder 18 under the lead terminal at a crack start point 26 near an intersection place among the sealing resin 20, the lead terminal 15, and the solder 18 under the lead terminal. With the crack 27, a flow path of the current flowing through the lead terminal 15 via the solder 18 under the lead terminal from the semiconductor element 14 is partially open. That is, in the power semiconductor module 10, the crack 27 is generated in the solder 18 under the lead terminal, and the crack 27 grows toward failure. Unlike the case in which the power semiconductor module 10 in Comparative example 1 instantly breaks down due to short-circuit, the pace of growth of the crack 27 is slow but nevertheless inevitably grows toward failure.

Figure 9:
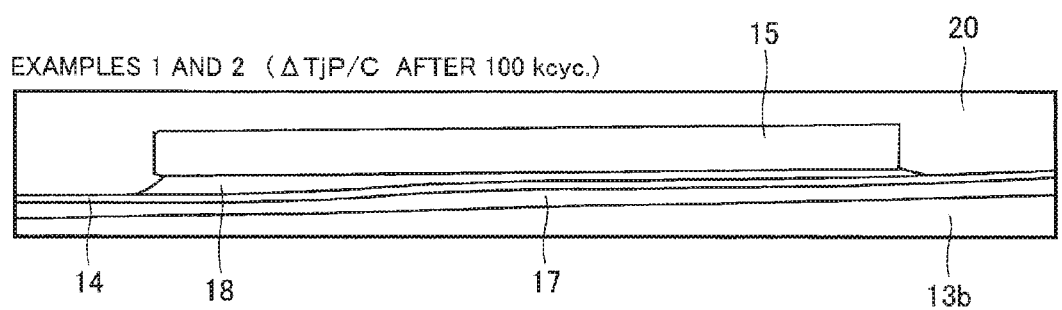
FIG. 9 is a partial cross-sectional view of a state of a power semiconductor module in Examples 1 and 2 when the power semiconductor module in Comparative example 1 reaches the lifetime.

FIG. 9 is a partial cross-sectional view of a state of a power semiconductor module in Examples 1 and 2 when the power semiconductor module in Comparative example 1 reaches the lifetime.

With a sample of the power semiconductor module 10 in Examples 1 and 2, picked up after the same number of times of power cycle as that in Comparative examples 1 and 2, a phenomenon such as a crack or deterioration is not observed in the solder 18 under the lead terminal. Based on the fact, when the 0.2% yield strength of the solder 18 under the lead terminal is made lower than that of the solder 17 under the semiconductor element, the deterioration of the solder 18 under the lead terminal is not observed, and therefore the reliability of the power semiconductor module 10 is improved. Such a combination of the solder 18 under the lead terminal and the solder 17 under the semiconductor element is effective for the power semiconductor module 10 having the bending portion where the bonding portion 15a and the raised portion 15b of the lead terminal 15 are connected. When the lead terminal 15 is constrained by the sealing resin 20 such as epoxy resin, it is further effective.

Note that, also with the power semiconductor module 10 in Examples 1 and 2, when a trouble occurs, the reason of the trouble is considered as the advance of the crack of the solder 18 under the lead terminal. Therefore, for such a phenomenon, the duration of life is predicted by periodic monitoring of the change in resistance value of the solder 18 under the lead terminal. Further, since the deterioration of the solder 18 under the lead terminal is not observed even in the power cycle test at approximately 100000 (100 kcyc.) times, the power semiconductor module 10 in Examples 1 and 2 is obviously effective for use in the thin semiconductor element 14 with a thickness of 100 µm or less.

(Second embodiment)

Figure 10:
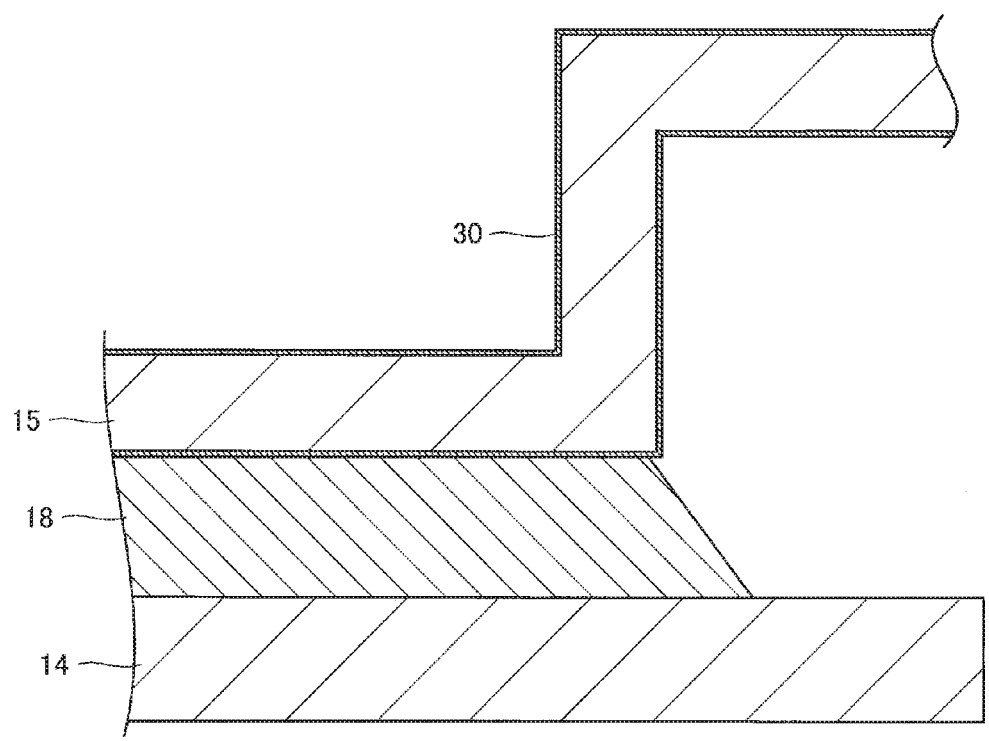
FIG. 10 is a partial enlarged cross-sectional view of an example of a power semiconductor module according to a second embodiment.

FIG. 10 is a partial enlarged cross-sectional view of an example of the power semiconductor module according to the second embodiment. In FIG. 10, the same reference numerals are added to the same or equivalent components as the corresponding components of the first embodiment, and a detailed description thereof is omitted.

In the second embodiment, the lead terminal 15 of the power semiconductor module 10 is changed from that of the first embodiment. That is, the surface of the lead terminal 15 is subjected to covering processing with a conductive material, thereby forming a cover 30. A material of the cover 30 is heterogeneous metal such as Ni, Ag, Au, and Pd (palladium). In the present embodiment, Ni is used and the thickness of the cover 30 is set to 10 µm or less.

In consideration of mass production, plating is preferably used for a forming method of the cover 30, and non-electrolytic plating or electrolytic plating is used. The concentration of phosphorus included in non-electrolytic Ni plating is preferably 50% or less so that the crystallization temperature of Ni does not fall below the temperature (260° C.) of the reflow furnace. More preferably, the concentration of phosphorus is 20% or less.

The covering processing of the surface of the lead terminal 15 by Ni plating prevents such a phenomenon that Cu elements forming the lead terminal 15 are diffused to the solder 18 under the lead terminal from occurring, even if thermal stress due to the power cycle test is applied. Consequently, the solder 18 under the lead terminal uses Sn-0.7Cu, but it is prevented that Cu forming the lead terminal 15 is diffused and the property changes from the initial physical property.

That is, regarding Sn as a main component of the solder 18 under the lead terminal, it is generally known that the solder strength is increased when Cu to be added to Sn increases. As a result, it is guessed that the solder 18 under the lead terminal partially enters a plastic deformation area corresponding to the same amount of deformation and the semiconductor element 14 is deformed by accumulation of the deformation.

On the other hand, in the second embodiment, the cover 30 functions as a diffusion barrier, and a diffusion phenomenon of Cu to the solder 18 under the lead terminal is not generated. Therefore, the temporal change of the stress applied to the semiconductor element 14 does not substantially occur.

Incidentally, after passage of the power cycle test 450000 (450 kcyc.) times by using the lead terminal 15 on which the cover 30 is not formed, such a phenomenon that the thin semiconductor element 14 deforms like waves is observed. In the solder 18 under the lead terminal, it is observed that the diffusion of Cu is wider as an area has a higher current density, which is possibly due to unevenness of the solder strength of the solder 18 under the lead terminal, and the unevenness of the expansion and contraction.

As a result, the power semiconductor module 10 according to the second embodiment has not only the advantages of the power semiconductor module 10 according to the first embodiment but also a protecting effect of the surface electrode of the semiconductor element 14 due to that the solder 18 under the lead terminal is not hardened.

In the above embodiment, as the solder 17 under the semiconductor element, Sn-5Sb or Sn-3.5Ag-0.5Cu is used. However, when the 0.2% yield strength is higher than that of the solder 18 under the lead terminal, the solder 17 under the semiconductor element is not limited to those. For example, as the solder 17 under the semiconductor element, there are Sn-8Sb-3Ag and the like. Further, the power semiconductor module 10 has an advantage when the insulating substrate 13 and the cooler 11 are connected with grease held therebetween, similarly to the direct bonding of the insulating substrate 13 and the cooler 11 with the solder 16.

With the power semiconductor module with the above structure, the stress applied to the surface electrode of the semiconductor element is reduced with the first solder by reduction of the 0.2% yield strength of the first solder on the side for directly receiving the stress from the lead terminal. As a consequence, advantageously, the reliability of the surface electrode of the semiconductor element is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power semiconductor module comprising:
    a semiconductor element having one surface and another surface opposite to the one surface;
    a lead terminal electrically and thermally connected to the semiconductor element;
    a first solder that bonds the lead terminal and the one surface of the semiconductor element;
    an insulating substrate including an insulating plate having one surface and another surface opposite to the one surface, a circuit layer arranged on the one surface of the insulating plate, and a metal foil arranged on the other surface of the insulating plate;
    a second solder that bonds the other surface of the semiconductor element and the circuit layer of the insulating substrate; and
    a resin that seals at least the semiconductor element, the lead terminal, the first solder, and the insulating substrate,
    wherein a 0.2% yield strength of the first solder is less than a 0.2%-yield strength of the second solder.

2. The power semiconductor module according to claim 1, wherein a thickness of the semiconductor element is 100 micrometers or less.

3. The power semiconductor module according to claim 1, wherein the semiconductor element includes a surface electrode that is bonded to the lead terminal by the first solder, and the surface electrode includes three layers of aluminum, nickel, and gold.

4. The power semiconductor module according to claim 3, wherein melting points of the first solder and the second solder are lower than a crystallization temperature of the nickel.

5. The power semiconductor module according to claim 3, wherein a surface of a guard ring of the semiconductor element is covered with a film of first polyimide, and a space between the first polyimide and the surface electrode is filled with second polyimide.

6. The power semiconductor module according to claim 1, wherein a surface of the lead terminal is covered with heterogeneous metal.

7. The power semiconductor module according to claim 6, wherein a method of the covering is plating.

8. The power semiconductor module according to claim 6, wherein a covering thickness of the lead terminal is 10 micrometers or less.

9. The power semiconductor module according to claim 6, wherein a covering material of the lead terminal is nickel.

10. The power semiconductor module according to claim 9, wherein a concentration of phosphorous contained in the nickel is 50% or less.

11. The power semiconductor module according to claim 9, wherein a concentration of phosphorous contained in the nickel is 20% or less.

12. The power semiconductor module according to claim 1, wherein a material of the lead terminal is copper.

13. The power semiconductor module according to claim 12, wherein a thickness of the lead terminal is 0.5 to 1.0 millimeter.

14. The power semiconductor module according to claim 1, wherein the first solder contains tin as a main component and contains copper at a concentration of 0.1 to 1.0 wt %.

15. The power semiconductor module according to claim 14, wherein the second solder contains tin as a main component, and contains antimony at a concentration of 0.1 to 15 wt %.

16. The power semiconductor module according to claim 14, wherein the second solder contains tin as a main component, and contains silver at a concentration of 3.5 wt % and copper at a concentration of 0.5 wt %.

17. The power semiconductor module according to claim 1, wherein the semiconductor element is an RC-IGBT.

18. The power semiconductor module according to claim 1, further comprising a cooler, the metal foil being mounted to the cooler via a third solder.

* * * * *